US008687874B2

(12) United States Patent
Hiraoka

(10) Patent No.: US 8,687,874 B2
(45) Date of Patent: Apr. 1, 2014

(54) METHOD OF INSPECTING ORGANIC ELECTROLUMINESCENCE DISPLAY DEVICE

(71) Applicant: Panasonic Corporation, Osaka (JP)

(72) Inventor: Tomomi Hiraoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 13/659,084

(22) Filed: Oct. 24, 2012

(65) Prior Publication Data

US 2013/0044937 A1 Feb. 21, 2013

Related U.S. Application Data

(63) Continuation of application No. PCT/JP2011/002396, filed on Apr. 22, 2011.

(30) Foreign Application Priority Data

Apr. 27, 2010 (JP) .................................. 2010-102415

(51) Int. Cl.
  *G06K 9/62* (2006.01)
  *G09G 3/00* (2006.01)
  *H01L 51/56* (2006.01)
(52) U.S. Cl.
  CPC ................ *G09G 3/006* (2013.01); *H01L 51/56* (2013.01); *H01L 2251/568* (2013.01)
  USPC ....................................................... 382/149
(58) Field of Classification Search
  None
  See application file for complete search history.

(56) References Cited

U.S. PATENT DOCUMENTS

| 6,909,111 | B2 | 6/2005 | Yamagata et al. | |
|---|---|---|---|---|
| 7,474,115 | B1* | 1/2009 | Trujillo et al. | 324/762.07 |
| 7,871,930 | B2 | 1/2011 | Yamagata et al. | |
| 7,874,888 | B2 | 1/2011 | Suzuki et al. | |
| 8,273,583 | B2* | 9/2012 | Yamagata et al. | 438/15 |
| 2002/0142697 | A1 | 10/2002 | Yamagata et al. | |
| 2005/0196892 | A1 | 9/2005 | Yamagata et al. | |
| 2009/0325450 | A1 | 12/2009 | Suzuki et al. | |
| 2010/0233931 | A1 | 9/2010 | Yamagata et al. | |
| 2011/0027918 | A1* | 2/2011 | Tanaka | 438/16 |
| 2011/0136266 | A1 | 6/2011 | Yamagata et al. | |
| 2012/0212475 | A1 | 8/2012 | Tajika et al. | |

FOREIGN PATENT DOCUMENTS

| JP | 2002-260857 | 9/2002 |
|---|---|---|
| JP | 2008-021441 | 1/2008 |
| JP | 2009-266687 | 11/2009 |

(Continued)

OTHER PUBLICATIONS

International Search Report in PCT/JP2011/002396, mailing date of Aug. 2, 2011.

*Primary Examiner* — Brian P Werner
(74) *Attorney, Agent, or Firm* — Greenblum & Bernstein, P.L.C.

(57) ABSTRACT

A method of inspecting an organic electroluminescence (EL) display device which includes pixels each of which includes an organic electroluminescence (EL) element includes: imaging the pixels for a predetermined time with a reverse bias voltage being applied to the pixels; identifying light emitting points which produce, in the imaging, light leakage that is greater than or equal to threshold intensity, the light emitting points being located within the pixels; and determining that a pixel including one light emitting point is a defective pixel when, after plural iterations of the imaging and the identifying, the light emitting point is identified in twice or more in the plural iterations of the identifying.

9 Claims, 9 Drawing Sheets

(56) References Cited

FOREIGN PATENT DOCUMENTS

| | | |
|---|---|---|
| JP | 2009-277528 | 11/2009 |
| JP | 2010-009964 | 1/2010 |
| JP | 2011-049159 | 3/2011 |
| WO | 2011/013493 | 2/2011 |

* cited by examiner

METHOD OF INSPECTING ORGANIC ELECTROLUMINESCENCE DISPLAY DEVICE

CROSS REFERENCE TO RELATED APPLICATIONS

This is a continuation application of PCT Patent Application No. PCT/JP2011/002396 filed on Apr. 22, 2011, designating the United States of America, which is based on and claims priority of Japanese Patent Application No. 2010-102415 filed on Apr. 27, 2010. The entire disclosures of the above-identified applications, including the specifications, drawings and claims are incorporated herein by reference in their entirety.

FIELD

One or more exemplary embodiments disclosed herein relate generally to methods of inspecting an organic electroluminescence display device, notably relating to a method of inspecting an organic electroluminescence display device having an organic electroluminescence element that can be repaired.

BACKGROUND

Organic electroluminescence displays using organic electroluminescence elements (hereinafter, referred to as organic EL elements) are well-known as image display devices using current-driven light-emitting elements. Due to such advantages as excellent viewing angle characteristics and low power consumption, such organic EL displays have gained much attention as candidates for next-generation flat panel displays (FPDs).

Organic EL elements included in pixels are normally arranged in a matrix shape. For example, in an organic EL display device referred to as an active-matrix organic EL display, a thin film transistor (TFT) is provided in each crosspoint between scanning lines and data lines, and a holding capacitance element (condenser) and the gate of a drive transistor is connected to the TFT. The TFT is turned on through a selected scanning line so as to input a data signal from a data line to the drive transistor and the holding capacitance element, and a light emission timing for an organic EL element is controlled by such drive transistor and the held capacitance element. With the configuration of the pixel drive circuit, in the active-matrix organic EL display, it is possible to cause the organic EL element to emit light until a subsequent scan (selection), and thus a reduction in display luminance is not incurred even when the duty ratio increases. However, in the active-matrix organic EL display, a manufacturing process which requires microfabrication when a structure of a pixel is finer and thinner or when the number of pixels is greater, an electrical defect such as a short circuit and a release of the organic EL element occurs.

Patent Literature 1 discloses a technique of detecting a defective pixel arising in the organic EL element in the manufacturing process of the organic EL display device. In Patent Literature 1, in an inspection device which includes a unit for applying a reverse bias voltage to organic EL elements, a unit for imaging a light leakage state from the organic EL elements under a completely light-shielding condition, and a unit for inspecting the light leakage, light leakage that is greater than or equal to a predetermined luminance is detected from the image. The technique makes it possible to detect a potentially defective portion of the organic EL element in a short time and to determine whether or not the whole of the organic EL element is a good product, and the inspection device cam be used as an inspection device for mass production.

CITATION LIST

Patent Literature

Patent Literature 1: Japanese Unexamined Patent Application Publication No. 2008-21441

SUMMARY

Technical Problem

However, in the method of detecting a defective portion disclosed in Patent Literature 1, since the light emission state generated by the application of a reverse bias voltage changes over time, light emission exists which cannot be detected depending on the imaging timing and therefore a pixel defect producing light leakage escapes.

One non-limiting and exemplary embodiment is conceived in view of the above described problem, and provides a method of inspecting and manufacturing an organic EL element in which a pixel defect does not escape even if the light emission state based on the application of a reverse bias voltage changes over time.

Solution to Problem

In one general aspect, the technique disclosed here features a method of inspecting an organic EL display device which includes pixels each of which includes an organic EL element, the method comprising: imaging the pixels for a predetermined time with a reverse bias voltage being applied to the pixels; identifying light emitting points which produce, in the imaging, luminance of light leakage that is greater than or equal to threshold intensity, the light emitting points being located within the pixels; and determining that a pixel including a one of the light emitting points is a defective pixel when, after plural iterations of the imaging and the identifying, the one light emitting point is identified twice or more in the plural iterations of the identifying, wherein the threshold intensity is set based on average luminance of the pixels that is obtained by imaging simultaneous light emission from all the pixels in the imaging.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The methods of inspecting and manufacturing an organic EL display device according to one exemplary embodiment or features disclosed herein make it possible to determine a defective pixel regardless of whether the light leakage based on the application of a reverse bias voltage occurs only initially and subsequently and flickers. Therefore, it is possible to prevent the escape of a defective pixel, manufacture an organic EL display device with high accuracy, and provide an organic EL display device having high quality.

BRIEF DESCRIPTION OF DRAWINGS

These and other advantages and features will become apparent from the following description thereof taken in conjunction with the accompanying Drawings, by way of a non-limiting example of embodiment disclosed herein.

FIG. 1 is a functional block diagram showing a configuration of an organic EL display device according to one exemplary embodiment.

FIG. 2A is a block diagram of a circuit of a normal pixel included in the organic EL display device.

FIG. 2B is a block diagram of a circuit of a defective pixel included in the organic EL display device.

FIG. 3 is a cross-sectional structural view of a pixel according to one exemplary embodiment.

FIG. 4 is a block diagram showing an inspection system for an organic EL display device according to one exemplary embodiment.

FIG. 5 is an operational flowchart for describing the method of inspecting the organic EL display device according to one exemplary embodiment.

FIG. 6 is an operational flowchart for describing Step S02 in the method of inspecting the organic EL display device according to one exemplary embodiment.

FIG. 7 is a diagram which shows an image obtained in Step S021 in the method of inspecting the organic EL display device according to one exemplary embodiment.

FIG. 8A is a graph which shows a mode in which the light leakage determined in the method of inspecting the organic EL display device according to one exemplary embodiment is eliminated over time.

FIG. 8B is a graph which shows a mode in which the light leakage determined in the method of inspecting the organic EL display device according to one exemplary embodiment continues regardless of the passage of time.

FIG. 8C is a graph which shows a mode in which the light leakage determined in the inspection method for the organic EL display device according to one exemplary embodiment frequently happens over time.

FIG. 8D is a graph which shows a mode in which the light leakage determined in the method of inspecting the organic EL display device according to one exemplary embodiment is discontinuous.

FIG. 9 is a graph which shows characteristics of an imaging point in which it is not determined as the light leakage point in the method of inspecting the organic EL display device according to one exemplary embodiment.

Figure 1:
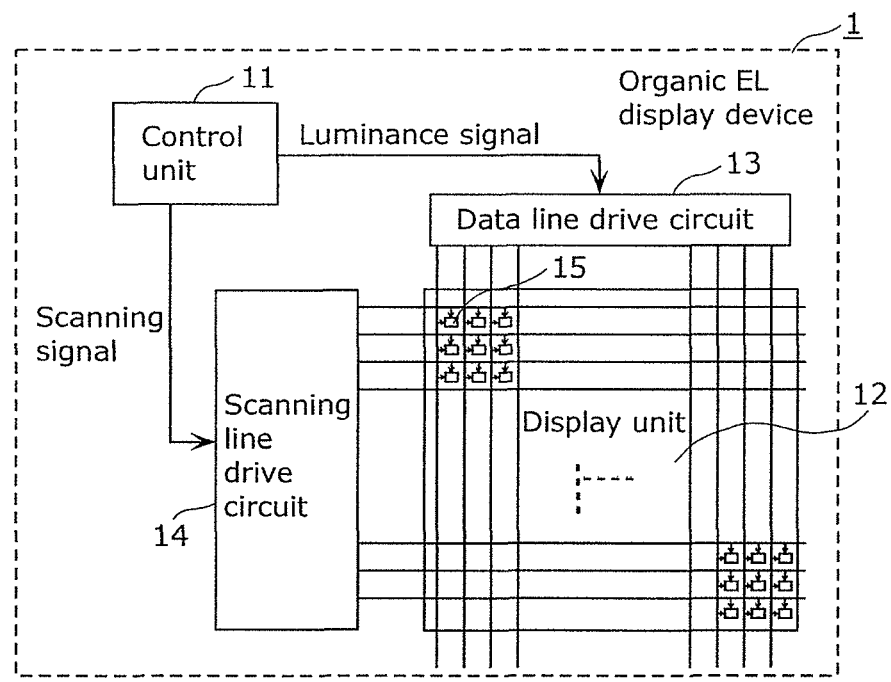
[FIG. 1]

DESCRIPTION OF EMBODIMENT (Underlying Knowledge Forming Basis of the Present Disclosure)

In relation to the methods of inspecting and manufacturing an organic EL display device disclosed in the Background section, the inventor has found the following problem.

In other words, the detection technique of Patent Literature 1 cannot identify the defective portion. This is because, among the defective portions, in an initial stage when the application of a reverse bias voltage is started, there is a defective portion which produces light leakage but eliminates light leakage later, and in an initial stage when the application of a reverse bias voltage is started, there is a defective portion which does not produce light leakage but produces light leakage later.

In one general aspect, the technique disclosed here features a method of inspecting an organic EL display device which includes pixels each of which includes an organic EL element, the method comprising: imaging the pixels for a predetermined time with a reverse bias voltage being applied to the pixels; identifying light emitting points which produce, in the imaging, luminance of light leakage that is greater than or equal to threshold intensity, the light emitting points being located within the pixels; and determining that a pixel including a one of the light emitting points is a defective pixel when, after plural iterations of the imaging and the identifying, the one light emitting point is identified twice or more in the plural iterations of the identifying, wherein the threshold intensity is set based on average luminance of the pixels that is obtained by imaging simultaneous light emission from all the pixels in the imaging.

Conventionally, the pixel having a defect such as short circuit is detected by applying a reverse bias voltage to the organic EL element and imaging the light leakage under a completely light-shielding condition. However, a pixel defect exists which cannot be detected depending on an imaging timing because the light emission to be imaged changes over time.

According to the present aspect, since it is determined that a pixel including the light leakage identified a plurality of times of the identifying is a defective pixel, it is possible to image the flickering light emission and the subsequent light emission. Moreover, this accordingly eliminates noise in the inspection, to increase detection accuracy of the defective pixel. In other words, a plurality of times of imaging are repeated for a predetermined time, coordinates and luminance intensity of the light emitting point are extracted each from the images, comparison is made among each of them. Then it is determined that the light emitting point which produces the same light emission a plurality of times is a defective position and that the light emitting point which produces only one light emission is normal (noise). Therefore, the escape of the defect can be prevented and it is possible to manufacture an organic El display device having high reliability.

For example, it is desirable that in the method of inspecting an organic EL display device according to an aspect of the present disclosure, a value of the reverse bias voltage is constant for the predetermined time for imaging the pixels in the imaging.

According to the present aspect, since a value of the reverse bias voltage applied to the light emission element do not vary in a predetermined time of imaging, it is possible to certainly capture the light leakage. It should be noted that in the present disclosure, the application of AC voltage is not performed by the alternation of a forward bias voltage and a reverse bias voltage.

For example, in the method of inspecting an organic EL display device according to one aspect of the present disclosure, the value of the reverse bias voltage applied to the pixels can be kept unchanged from a start of a first iteration of the imaging to an end of a final iteration of the imaging in the plural iterations of the imaging.

For example, in the imaging, application of the reverse bias voltage to the pixels and imaging of the pixels may be synchronized.

For example, it is desirable that in the method of inspecting an organic EL display device according to one aspect of the present disclosure, the predetermined time for imaging the pixels in the imaging varies from 5 seconds to 60 seconds.

With the present aspect, it is possible to realize detection of a defective pixel with high accuracy in an appropriate detection period. When the period is too long, the luminance value by the light leakage from the defective pixel is averaged and a noise level increases and an S/N ratio decreases. When the period is too short, the absolute value of the luminance value is small and it is not possible to obtain sufficient signal intensity.

For example, it is desirable that in the method of inspecting an organic EL display device according to one aspect of the present disclosure, the imaging and the identifying are each repeated from 3 to 10 times.

With the present aspect, it is possible to realize detection of a defective pixel with high accuracy in an appropriate detection period. When the number of repetitions is twice, it is determined that the only pixel having a light emitting point specified as the light leakage point in the twice in which the light leakage changes over time is a defective pixel. Therefore, the probability significantly increases that the pixel in which the light leakage changes over time is escaped as a normal pixel. Meanwhile, when the number of repetitions is 11 times or more, the detection period is longer manufacturing cost is higher if the detection step is one of the manufacturing process. Therefore, the above described method is not appropriate.

For example, it is desirable that in the method of inspecting an organic EL display device according to one aspect of the present disclosure, in the imaging, imaging is performed by a cooled CCD camera, and in the identifying, the light emitting points which produce light leakage are identified based on an image obtained from the imaging.

With the present aspect, even in the imaging of weak light leakage of an organic EL element, it is possible to secure a predetermined S/N ratio. This accordingly eliminates noise in the inspection, to increase detection accuracy of the defective pixel.

For example, in the method of inspecting an organic EL display device according to one aspect of the present disclosure, when the one light emitting point is identified twice or more in the plural iterations of the identifying and the one light emitting point is not identified in the final iteration of the identifying in the plural iterations of the identifying, the pixel including the light emitting point may be determined as a defective pixel in the determining.

For example, in the method of inspecting an organic EL display device according to one aspect of the present disclosure, in the imaging, the average luminance of the pixels is calculated as an average value of noise by imaging simultaneous light emission from all the pixels, and in the identifying, from an image obtained by imaging light emitted from the pixels or part of the pixels, a light emitting point producing light emission that is greater than or equal to the threshold intensity is identified as a light emitting point producing light leakage, the threshold intensity being a value obtained by adding a predetermined offset value to the average value of noise.

With the present aspect, it is possible to set noise level depending on the imaging situation in the imaging of the weak light leakage of an organic EL element. Since threshold intensity for identifying the light leakage point can be set from the noise level and an arbitrary offset value, it is possible to realize the detection of a defective pixel with high accuracy in correspondence with the imaging situation and the light leakage situation.

It should be noted that the present disclosure can be implemented not only as a method of inspecting an organic EL display device but also as a method of manufacturing an organic EL display device.

Hereinafter, a certain exemplary embodiment is described in greater detail with reference to the accompanying Drawings.

The exemplary embodiment described below shows a general or specific example. The numerical values, shapes, materials, structural elements, the arrangement and connection of the structural elements, steps, the processing order of the steps etc. shown in the following exemplary embodiment are mere examples, and therefore do not limit the scope of the appended Claims and their equivalents. Therefore, among the structural elements in the following exemplary embodiment, structural elements not recited in any one of the independent claims are described as arbitrary structural elements.

Embodiment

A method of inspecting an organic EL display device which includes pixels each of which includes an organic EL element includes: imaging the pixels for a predetermined time with a reverse bias voltage being applied to the pixels; identifying light emitting points which produce, in the imaging, luminance of light leakage that is greater than or equal to threshold intensity, the light emitting points being located within the pixels; and determining that a pixel including a one of the light emitting points is a defective pixel when, after plural iterations of the imaging and the identifying, the one light emitting point is identified twice or more in the plural iterations of the identifying. With this, it is possible to prevent the escape of a defective pixel and to manufacture an organic EL display device having high reliability.

Hereinafter, certain exemplary embodiments are described in greater detail with reference to the accompanying Drawings. First, the configuration of the organic EL display device to be inspected according to an inspection method according to the present disclosure.

FIG. 1 is a functional block diagram showing a configuration of an organic EL display device according to the embodiment. An organic EL display device 1 shown in FIG. 1 includes a control unit 11, a display unit 12, a data line drive circuit 13, and a scanning line drive circuit 14.

The control unit 11 converts a video signal that is input externally into a luminance signal which determines light emission of the pixel, and then outputs the signal voltage to the data line drive circuit 13 in a scan order. Moreover, the control unit 11 controls a timing for outputting a luminance signal outputted from the data line drive circuit 13 and a timing for outputting a scan signal outputted from the scanning line drive circuit 14.

The data line drive unit 13 outputs a luminance signal to each of the data lines, to realize light emission of the pixel corresponding to the video signal.

The scanning line drive circuit 14 outputs a scan signal to each of the scanning lines, to drive a circuit element having the pixel at a predetermined drive timing.

In the display unit 12, a plurality of pixels are provided in a matrix shape. Each of the pixels emits light in correspondence with a luminance signal from the data line drive circuit 13 and a scan signal from the scanning line drive circuit 14.

Figure 2A:
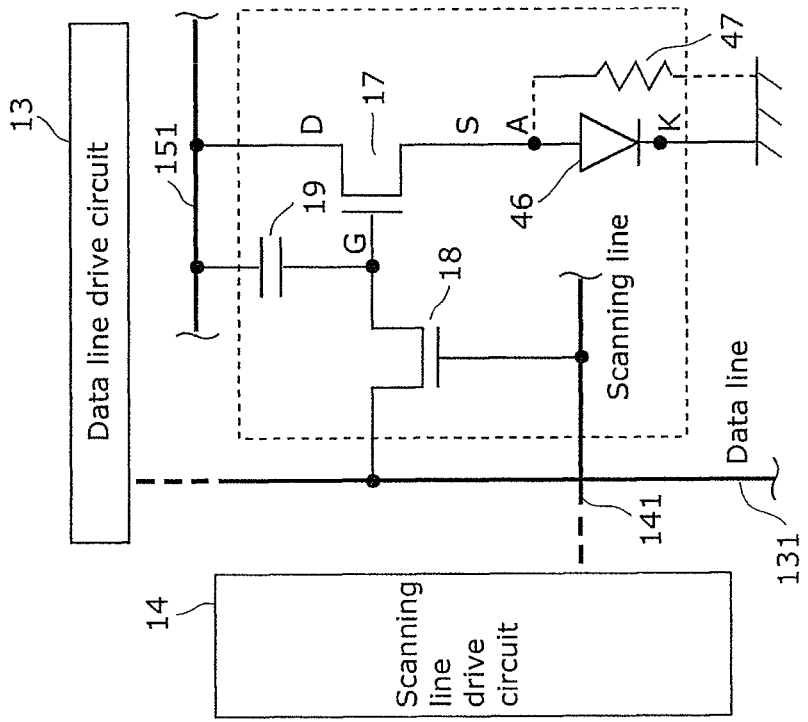
[FIG. 2A]

FIG. 2A is a block diagram of a circuit of a normal pixel included in the organic EL display device. A pixel 15 shown in FIG. 2A includes an organic EL element 16, a drive transistor 17, a selection transistor 18, and a capacitor 19. Moreover, a data line 131 is provided in each of the pixel columns, a scanning line 141 is provided in each of the pixel rows, and a positive power wire 151 and a negative power wire 152 are provided to all pixels 15. A drain electrode of the selection transistor 18 is connected to the data line 131, a gate electrode of the selection transistor 18 is connected to the scanning line 141, a source electrode of the selection transistor 18 is connected to the capacitor 19 and a gate electrode of the drive transistor 17. Moreover, the drain electrode of the drive transistor 17 is connected to the positive power wire 151, and the source electrode is connected to an anode of the organic EL element 16.

Here, a structure of the organic EL element 16 will be described.

Figure 3:
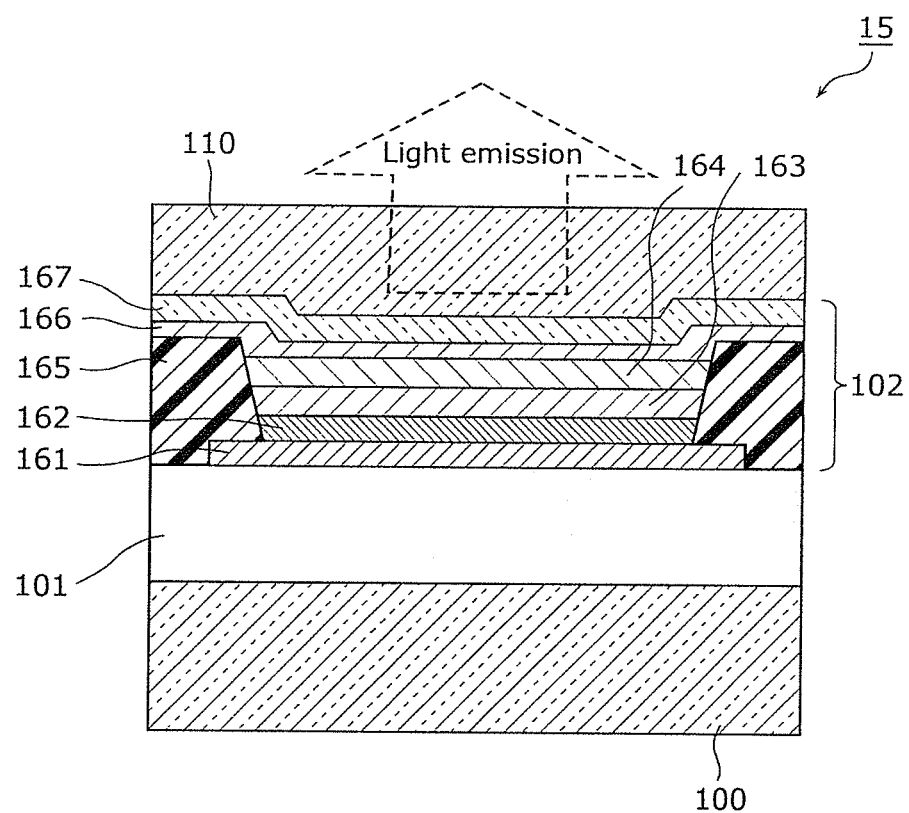
[FIG. 3]

FIG. 3 is a cross-sectional structural view of a pixel according to one exemplary embodiment. The pixel 15 shown in FIG. 3 includes a substrate 100, a drive circuit layer 101, a luminescent layer 102, and a transparent encapsulating film 110.

The substrate 100 is, for example, a glass substrate. Moreover, the substrate 100 may use a flexible substrate made of resin. The substrate 100, along with the drive circuit layer 101, constitutes a thin film transistor (TFT) substrate. It should be noted that in a top emission structure shown in FIG. 3, the substrate 100 does not have to be transparent. For example, a non-transparent substrate such as silicon substrate can be used.

The drive circuit layer 101, although not illustrated, includes the drive transistor 17, the capacitor 19, and the selection transistor 18 that are formed above the substrate 100. The drive circuit layer 101 is provided with flatness on the upper surface by a flattening film.

The luminescent layer 102 includes an anode 161, a hole injection layer 162, a hole transport layer 163, an organic luminescent layer 164, a bank layer 165, an electron injection layer 166, and a transparent cathode 167.

The pixel 15 shown in FIG. 3 has a top emission structure. In other words, when a voltage is applied to the luminescent layer 102, light is generated at the organic luminescent layer 164, and then light emits upward via the transparent cathode 167 and the transparent encapsulating film 110. Moreover, light which is generated by the organic luminescent layer 164 and emits downward is reflected by the anode 161, and light emits upward via the transparent cathode 167 and the transparent encapsulating film 110.

The anode 161 is laminated on the surface of the flattening film of the drive circuit layer 101 and is an electrode which applies a positive voltage with respect to the transparent cathode 167 to the luminescent layer 102.

The hole injection layer 162 is formed on the surface of the anode 161, and has a function to reliably inject holes into the organic luminescent layer 164 and a function to support the reliable generation of the hole for injection into the organic luminescent layer 164. With this, the drive voltage of the luminescent layer 102 can be lower and an element can have a longer lifetime due to reliability of the hole injection.

The hole transport layer 163 is formed on the surface of the hole injection layer 162, efficiently transports a hole injected from the hole injection layer 162 to the organic luminescent layer 164, prevents deactivation of an exciton on an interface between the organic luminescent layer 164 and the hole injection layer 162, and further has a function to block an electron.

It should be noted that there is a case where the hole transport layer 163 is omitted depending on a material for the hole injection layer 162 and the organic luminescent layer 164 that are adjacent layers.

The organic luminescent layer 164 is formed on the surface of the hole transport layer 163, and has a function to recombine by injection of the hole and the electron, to generate excitation and emit light. A material for the organic luminescent layer 164 can be not only a low molecular organic material but also an organic polymeric material having light emission in which a film can be manufactured by a wet film forming method represented by ink jet and spin coating.

The bank layer 165 is formed on the surface of the hole injection layer 162 and has a function as a bank which forms the hole transport layer 163 and the organic luminescent layer 164 formed in a wet film forming method in a predetermined region.

The electron injection layer 166 is formed on the organic luminescent layer 164. It has a function to reduce a barrier of electron injection into the organic luminescent layer 164 to lower the drive voltage of the luminescent layer 102, and to restrict exciton deactivation. With this, electron injection is reliable enough to extend the lifetime of the element, and the number of element defects can be decreased by improving evenness of the light emission surface through increasing adhesion with the transparent cathode 167.

The transparent cathode 167 is laminated on the surface of the electron injection layer 166, and has a function to apply a negative voltage with respect to the anode 161 to the luminescent layer 102 and to inject an electron into the element (especially, the organic luminescent layer 164).

The transparent encapsulating film 110 is formed on the surface of the transparent cathode 167 and has a function to protect the element from moisture. Moreover, the transparent encapsulating film 110 needs to be transparent.

With the above described structure of the pixel 15, the organic EL display device 1 has a function as an active-matrix display device.

In the above configuration, when a scan signal is input to the scanning line 141 and the selection transistor is turned on, a luminance signal corresponding to the light emission gray level supplied via the data line 131 is written in the capacitor 19. Then, the holding voltage written in the capacitor 19 is held through a frame period. By the holding voltage, the conductance of the drive transistor 17 changes in an analog manner and drive current corresponding to a light emission gray level is supplied to the anode of the organic EL element 16. Furthermore, the drive current supplied to the anode of the organic EL element 16 flows to the cathode of the organic EL element 16. With this, the organic EL element 16 emits light and is displayed as an image. At this time, a forward bias voltage corresponding to the signal voltage is being applied to the anode of the organic EL element 16.

It should be noted that a circuit configuration of the above described pixel is not limited to the circuit configuration shown in FIG. 2A. The selection transistor 18 and the drive transistor 17 are circuit constituent elements necessary for flowing the drive current corresponding to the voltage value of the luminance signal to the organic EL element 16. However, they are not limited to the above described embodiment. Moreover, when a configuration in which another circuit configuration element is added to the above described circuit configuration element, it is included in the pixel circuit of the organic EL display device according to the present disclosure.

However, in the active-matrix organic EL display device, a manufacturing process which requires microfabrication when a structure of a pixel is finer and thinner or when the number of pixels is greater, an electrical defect such as a short circuit and a release between the anode and cathode of the organic EL element occurs.

Figure 2B:
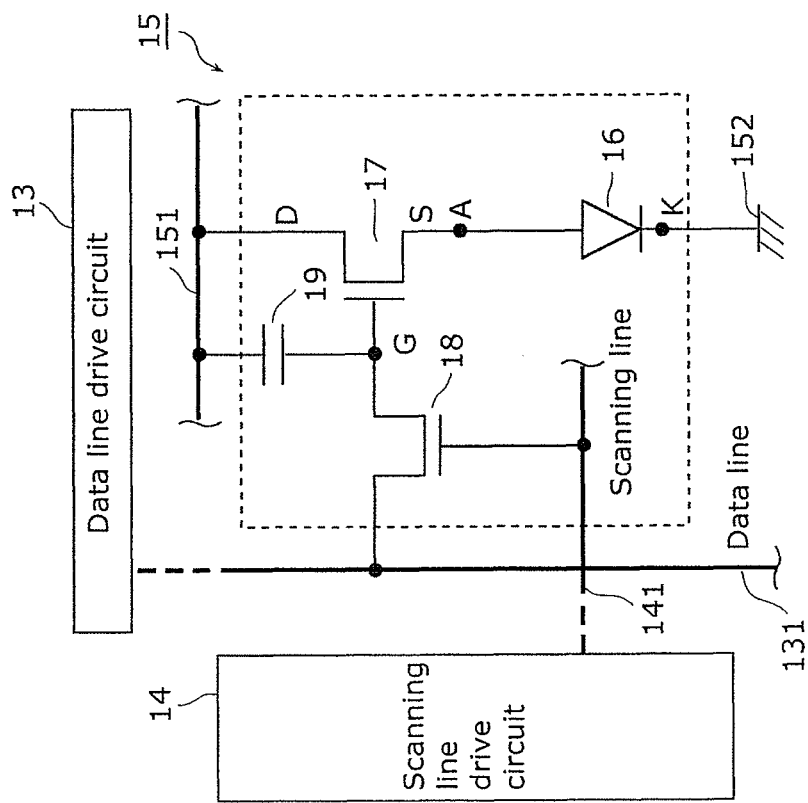
[FIG. 2B]

FIG. 2B is a block diagram of a circuit of a defective pixel included in the organic EL display device. The circuit configuration shown in FIG. 2B indicates a state in which a short circuit exists between the anode and the cathode of the organic EL element. In other words, compared with the circuit configuration shown in FIG. 2A, the difference is that a short circuit component 47 which realizes electrical conduction between the anode and cathode of an organic EL element 46 is connected in parallel. Here, the state in which the organic EL element 46 is shorted means that when the resistance value of the short circuit component 47 is low resistant, the organic EL element 46 is in a short circuit state. As an example of the short circuit state between the anode and cathode of the organic EL element 46, it is believed that the hole transport layer 163 and the electron injection layer 166 which sandwiches the organic luminescent layer 164 is in point contact with each other via a pinhole generated in the organic luminescent layer 164, due to unevenness of the film thickness of the organic luminescent layer 164 shown in FIG. 3.

Even when a forward bias voltage corresponding to the signal voltage is applied to a defective pixel shown in FIG. 2B, a short circuit current flows in the short circuit component 47. As a result, current corresponding to a forward bias voltage does not flow in the organic EL element 46 and therefore the organic EL element 46 does not emit light normally.

In order to ensure display quality of the organic EL display panel, it is necessary to prevent the escape of a defective pixel having the short circuit component 47, and to certainly pass the defective pixel to the repair process. A repair process for removing the short circuit component 47 includes, for example, irradiating the existence position of the short circuit component 47 with a laser. With this, when a forward bias voltage is applied to a laser-repaired pixel and the pixel normally emits light, the repair portion becomes a black spot but normal light emission is performed in the remaining light emission area.

A method of detecting the defective pixel includes a method of detecting a light emitting point producing light leakage by the application of the reverse bias voltage to the organic EL element. In the normal pixel, current does not flow in the organic EL element due to the reverse bias voltage. In the organic EL element having the short circuit component 47, however, light leakage caused by leakage current can be observed in the short circuit portion.

In a conventional method, with the image obtained by the imaging of the light leakage state, a light leakage point in the pixel is identified. However, since the light leakage state caused by the application of the reverse bias voltage changes over time, the light emission exists which cannot be detected depending on an imaging timing and the defective pixel which produces light leakage escapes without being passed to the repair process.

In the method of inspecting the organic EL display device according to the present disclosure, it is possible to prevent the escape of a pixel defect even when the light emission state producing light leakage changes over time.

Next, an inspection method of the organic EL display device according to the present disclosure will be described.

Figure 4:
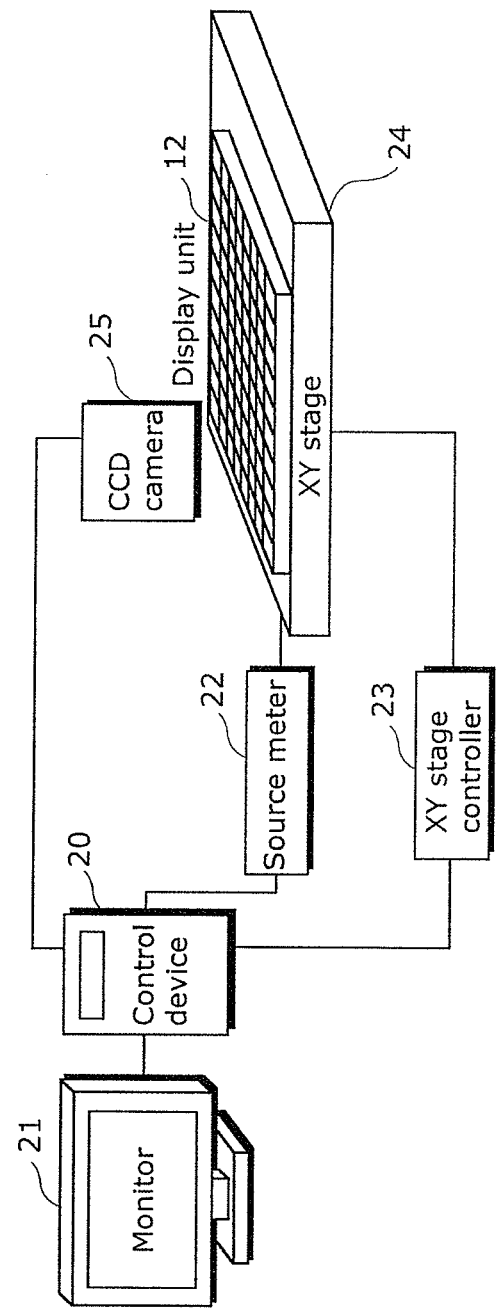
[FIG. 4]

FIG. 4 is a block configuration diagram showing an inspection system for an organic EL display device according to the present embodiment. The system shown in FIG. 4 includes a control device 20, a monitor 21, a source meter 22, an XY stage controller 23, an XY stage 24, and a Charge Coupled Device (CCD) camera 25. Moreover, FIG. 4 describes a scene when the light emission state of the display unit 12 included in the organic EL display device 1 is being imaged by the CCD camera 25.

The control device 20 causes the source meter 22 to apply, in a predetermined period, a reverse bias voltage to each of the pixels 15 included in the display unit 12. Moreover, the control device 20 causes the XY stage controller 23 to shift the XY stage 24 such that the CCD camera 25 can image the light emission state of the pixel which is an imaging target. Moreover, the control device 20 causes the CCD camera 25 to image the light emission state of the pixel which is an imaging target in the above described period, and then obtains the captured image from the CCD camera 25. Moreover, the control device 20 identifies, within the above described period, the light emitting point producing light leakage from the image which is obtained from imaging light emitted from all the pixels 15 or some of the pixels 15. Moreover, when the process for the application of the reverse bias voltage and the identification of the light emitting point is caused to be performed a plurality of times, and the same light emitting point is identified in twice or more of the process, the control device 20 determines that the pixel including the light emitting point is a defective pixel. Moreover, the control device 20 displays the information of the determined defective pixel on the monitor 21.

Figure 5:
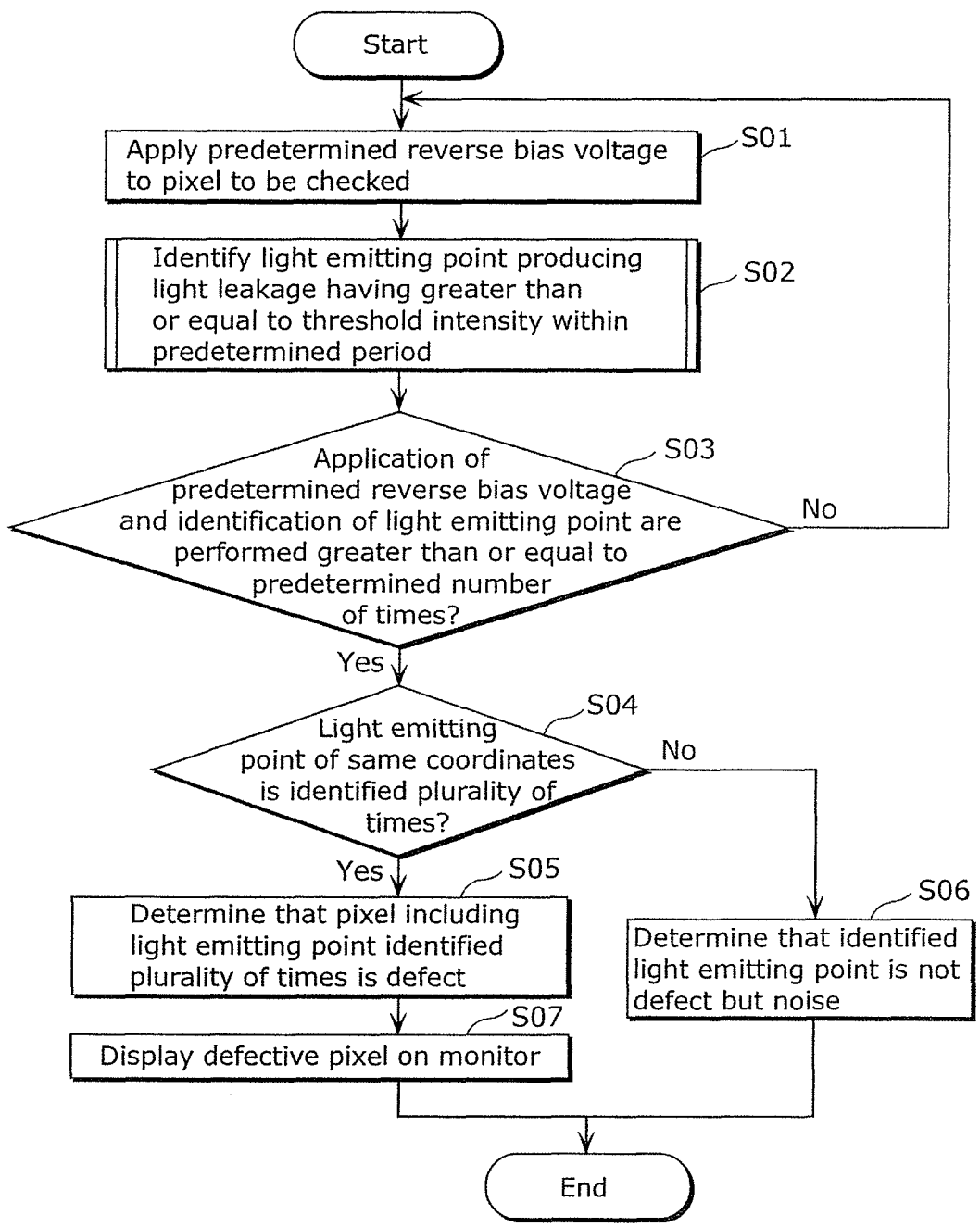
[FIG. 5]

FIG. 5 is an operational flowchart for describing the method of inspecting the organic EL display device according to the present embodiment. In the inspection method, among the pixels included in the organic EL display device, a defective pixel in which the organic EL element is in a short-circuit state is identified with high accuracy.

First, the control device 20 applies a predetermined reverse bias voltage to the pixel 15 to be checked (S01). More specifically, the control device 20 causes the source meter 22 to apply, for a predetermined time, a certain reverse bias voltage to the pixel to be checked. With this, since in the predetermined time for imaging, the value of the reverse bias voltage applied to the organic EL element 16 does not vary, it is possible to certainly capture the light leakage. It should be noted that the application of a voltage with the use of AC voltage in which a forward bias voltage and a reverse bias voltage are alternately applied is not performed. For example, common terminals each of which bundles the drain electrodes of all the drive transistors 17 in the display unit 12, the cathode electrodes of all the organic EL elements 16 in the display unit 12, and the gate electrodes of all the drive transistors 17 in the display unit 12 are provided on an end portion of the panel, and then each of the common terminals is connected to the source meter 22. With this, a voltage of 15 V to 25 V is applied to the cathode electrode (K) of the organic EL element 16, and making the drain electrode (D) of the drive transistor 17 a GND potential. Moreover, during this time, the drive transistor 17 needs to be turned on such that the presence or absence of the light leakage caused by reverse direction leakage current of the organic EL element can be observed. Therefore, during this time, for example, 0V is applied to the gate electrode (G) of the drive transistor 17. Moreover, when the light leakage of the organic EL element is detected with the present technique, it is desirable that a reverse bias voltage is applied to the organic EL element 16 under a condition in which the drive transistor 17 is in a saturation region. With this, in the detection of the light leakage, it is possible to restrict an influence of variations in characteristics of the drive transistor 17.

Moreover, for example, common terminals each of which bundles the cathode electrodes of all the organic EL elements 16 in the display unit 12, and the anode electrodes of all the organic EL elements 16 in the display unit 12 are provided on an end portion of the panel, and then each of the common terminals is connected to the source meter 22. With this, a voltage of 15 V to 25 V is applied to the cathode electrode (K) of the organic EL element 16, making the cathode electrode (K) a GND potential.

Moreover, for example, probes are in contact with all terminals for each of the pixels 15 included in the display unit 12, and then a predetermined reverse bias voltage is applied to the whole plane or a selected area. In this case, by causing a test pin to be in contact with all terminals disposed in the whole of the display unit 12, the defective pixel to be checked and the normal pixel to be compared may be identified by a switch operation by a multiplexer or the like. Alternately, a test pin may be in contact with only a wiring of the pixel to be checked for measurement, and the test pin may be shifted on the display unit 12 and be in contact with the target pixel. Moreover, it is acceptable to hold a plurality of pins that is a block that is a plurality of pixel units, and to include a probe which can move on the display unit 12.

Next, the control device 20 identifies the light emitting point which produces light leakage that is higher than or equal to a threshold intensity during a period when the reverse bias voltage is being applied in Step S01 (S02). The operation in Step S02 will be described in detail.

Figure 6:
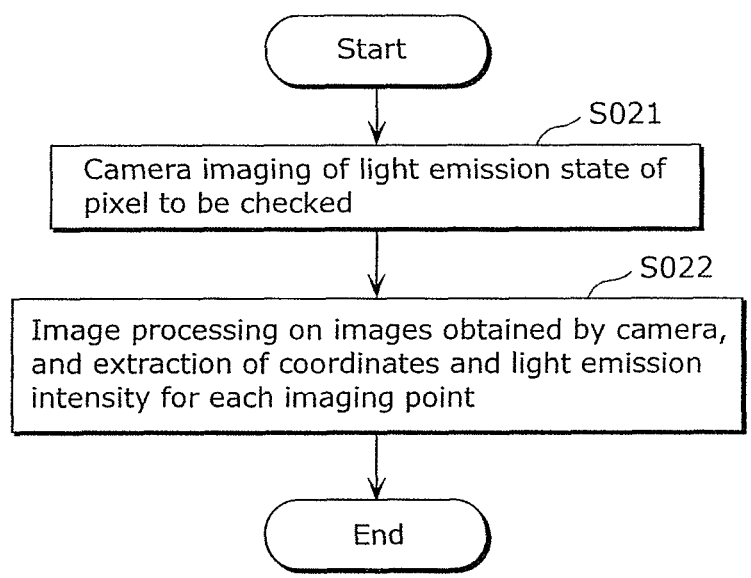
[FIG. 6]

FIG. 6 is an operational flowchart for describing Step S02 in the method of inspecting the organic EL display device according to the present disclosure.

First, the control device 20 causes the CCD camera 25 to image a light emission state of the pixel 15 to be checked in a period of applying the reverse bias voltage (S021). It should be noted that since the light leakage caused by the application of the reverse bias voltage is weak, it is desirable that the imaging using the CCD camera is performed under a complete light-shielding condition. Moreover, it is desirable that exposure time for the camera imaging is 5 seconds to 60 seconds and the condition of the exposure time is optimized by an S/N ratio. With this, it is possible to detect a light emitting point with high accuracy in an appropriate detection period. As a result, it is possible to detect a defective pixel with high accuracy. If the exposure time is too long, the luminance value by the weak light leakage is averaged. Moreover, a noise level increases and the S/N ration decreases. Moreover, if the above described period is too short, the absolute value of the light emission value by the light leakage from the defective pixel is too small to obtain sufficient signal intensity.

The above-described Step S01 and Step S021 correspond to the first step in which the pixels are imaged for a predetermined time with the reverse bias voltage is being applied to a plurality of pixels.

Next, the control device 20 performs image processing on the image obtained by the camera imaging in Step S021 to extract imaging information about the each of the imaging points (coordinates and light emission intensity) (S022).

Figure 7:
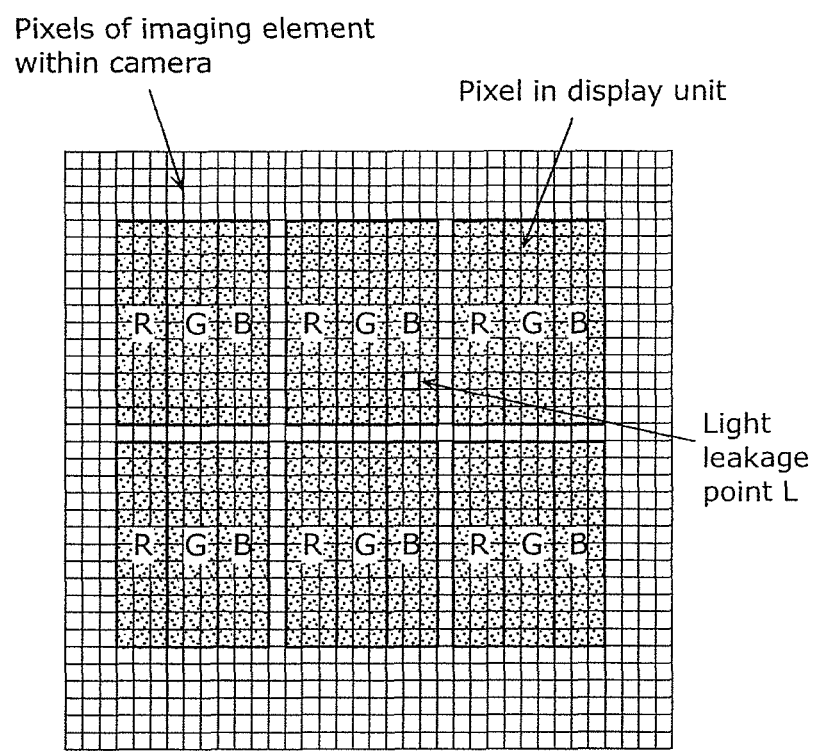
[FIG. 7]

FIG. 7 is a diagram which shows an image obtained in Step S021 in the method of inspecting an organic EL display device according to the present embodiment. Each of the imaging elements included in the CCD camera 25 is much smaller than the pixel 15 (subpixels indicated by R, G and B in FIG. 7). Therefore, the CCD camera 25 has accuracy of detecting a light leakage point which can be scattered in the area of the organic EL element. By performing image processing on the above described image, the imaging information (coordinates and light emission intensity) is associated with each of the imaging elements that are imaging points.

Moreover, in FIG. 7, the case is described where the light leakage point L is emitting with a higher luminance than that of the other areas. Here, a method of determining whether or not each of the imaging points is identified as a light leakage point will be described.

First, average luminance of the pixels that are imaged simultaneously in the period of applying the reverse bias voltage is calculated. More specifically, the average luminance is determined by dividing a sum of the light emission intensity of imaging points within the areas of the pixels that are imaged simultaneously, by the number of imaging points within the areas of the pixels that are imaged simultaneously. This is determined as an average value of noise.

Next, a value obtained by the addition of an offset value to the average value of noise is determined as threshold intensity. Here, the offset value is a value which is determined by an S/N ratio necessary for identifying the light leakage point with high accuracy. The offset value can be variously set according to variations in characteristics of the inspection system and the display panels.

Next, from the pieces of information for each of the imaging points in the above described image, the light emitting point which produces light emission that is greater than or equal to the threshold intensity is identified as the light leakage point. In other words, by binarizing the light emission intensity with the threshold intensity, it is determined whether it is really the light leakage point.

It should be noted that the CCD camera 25 used in Step S02 is a cooled CCD camera. This allows securing a predetermined S/N ratio in the imaging of a weak light leakage of the organic EL element. This accordingly eliminates noise in the inspection, to increase detection accuracy of the defective pixel.

A plurality of the CCD cameras 25 may be installed for imaging the whole area of the display unit 12 according to camera view, and image processing may be performed on the images captured by each of the CCD cameras.

Moreover, a part of the area of the display unit 12 may be imaged and image processing may be performed on the images obtained by a sequential scan of the area.

Above described Step S022 corresponds to the second step of identifying the light emitting point producing light leakage that is greater than or equal to the threshold intensity in Step S01 and Step S021.

The method of inspecting an organic EL display device according to the present disclosure will be described again with reference to the operational flowchart shown in FIG. 5.

Next, the control device 20 performs a plurality of times the application of a predetermined reverse bias voltage in Step S01 and the identification of a light leakage point in Step S02 on the pixel to be checked.

When the above described Steps S01 and S02 are performed a plurality of times (Yes in Step S03) and when the same light leakage point is identified (Yes in Step S04) in twice or more of the step in the plurality of times of Step S02, it is determined that the pixel 15 including the light leakage point is a defective pixel (S05). Meanwhile, when the same light leakage point is not identified in twice or more of steps in the plurality of times of Step S02 (No in Step S04), it is determined that the light leakage point identified by only one time of the step is a noise (S06). In other words, it is determined that the pixels which include only the light leakage point identified in only one time of the step and the pixels in which the light leakage point is not identified are normal pixels.

The above described Step S04 and Step S05 correspond to the third step in which when, after repeating a plurality of times Step S01 and Step S02, the same light emitting point is identified in twice or more of the step in the plurality of times of Step S022, it is determined that the pixel including the light emitting point is a defective pixel.

From the start of the first step S01 to the end of the final step S01 among a plurality of times of Step S01, it is desirable that the value of the reverse bias voltage applied to the pixels is not varied. Instead, the application of the reverse bias voltage to the pixels in Step S01 and the imaging of the pixels in Step S021 may be synchronized.

It is desirable that the number of repetitions of Step S01 and Step S02 is from 3 to 10 times. With this, it is possible to realize the detection of a defective pixel with high accuracy in an appropriate detection period. When the number of repetitions is twice, it is determined that only the pixel having a light emitting point that is identified as a light leakage point in the twice is a defective pixel. This substantially increases the probability that the pixel having a light emitting point in which light leakage changes over time escapes as a normal pixel. When the number of repetitions is 11 times or more, the detection time is longer and manufacturing cost is higher if the detection step is one of the manufacturing process. Therefore, the above described method is not appropriate.

When the light emission which changes over time is imaged, it is desirable that the above described Step S01 and Step S02 should be repeated within a predetermined time.

FIGS. 8A to 8D are each a graph showing characteristics of the light leakage point included in the defective pixel determined in the method of inspecting an organic EL display device according to the present disclosure. A piece of data in each of the bar charts as shown in FIGS. 8A to 8D is light emission intensity of an imaging point extracted from the image obtained from exposure imaging of the light emission state for 30 seconds by the CCD camera 25, after the application of the reverse bias voltage to all the pixels 15 in the display unit 12. Moreover, a plurality of pieces of data in each of the bar charts show a result of obtaining 10 times the light emission intensity of the same imaging point by the light emission for 30 seconds.

It should be noted that in the graphs shown in FIGS. 8A to 8D, the threshold intensity of light emission level for identifying the light leakage is set at 500 cd. In this case, for example, in the period of the application of the reverse bias voltage, an average luminance of all the pixels 15 is calculated. More specifically, it is determined that a value obtained by dividing a sum of light emission intensity of imaging points within the areas of all the pixels 15 that are imaged simultaneously, by the number of imaging points within the areas of the pixels 15 that are imaged simultaneously, is an average value of noise for the all pixels 15. Here, assume that 400 cd/m$^2$ is gained as the average value of noise. Assume that the value obtained by adding the offset value to the average value of noise is determined as threshold intensity. Here, the offset value is a value which is determined by an S/N ratio necessary for identifying the light leakage point with high accuracy. For example, the offset value is 100 cd/m$^2$. As a result, the threshold intensity is calculated by 400 cd/m$^2$+100 cd/m$^2$=500 cd/m$^2$.

Figure 8A:
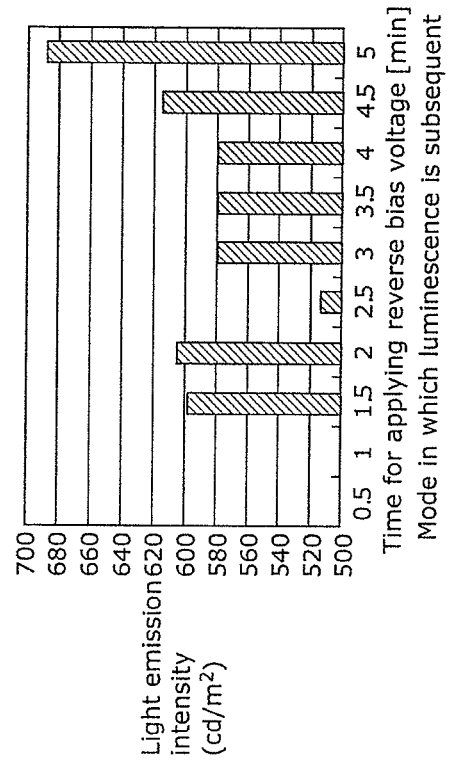
[FIG. 8A]

The imaging point indicated by the graph shown in FIG. 8A is a mode in which the light emission is eliminated over time. Among the light emission operations for the 10th consecutive time, the light emission in the first half of the light emission operations is detected. Behind such a light emission mode, it is believed that since current flows in the low resistance portion which gradually develops by the application of the reverse bias voltage, the light leakage is removed. The present disclosure makes it possible to certainly determine that the pixel showing such a light emission mode is a defective pixel.

Figure 8C:
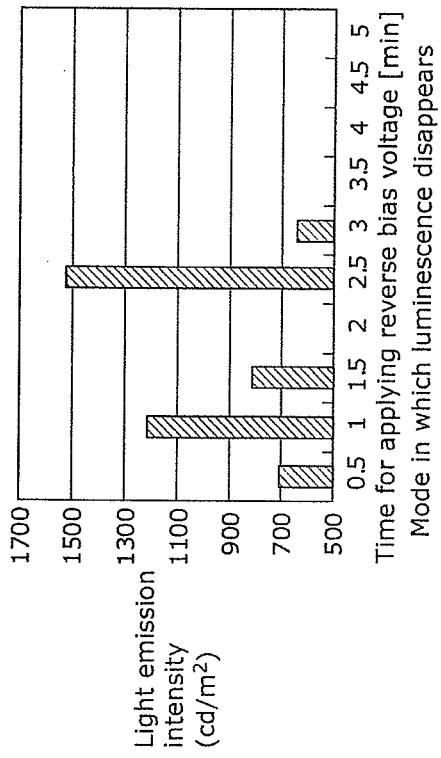
[FIG. 8C]
Figure 8B:
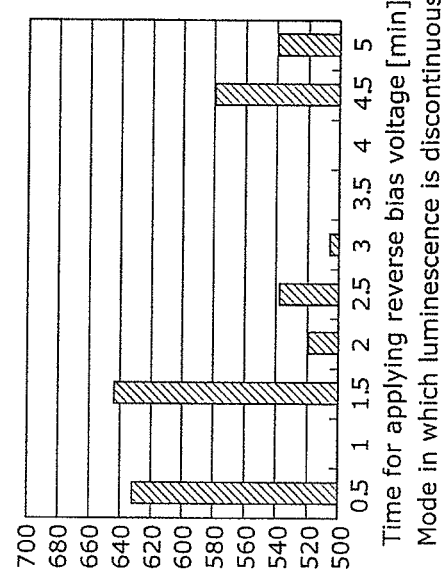
[FIG. 8B]

The imaging point indicated by the graph shown in FIG. 8B is a mode in which light emission is continuous regardless of the passage of time. Light emission is detected over the light emission operations for the 10th consecutive time.

The imaging point indicated by the graph shown in FIG. 8C is a mode in which light emission frequently happens over time. Light emission is detected in the latter half of the light emission operations over the light emission operations for the 10th consecutive time.

Figure 8D:
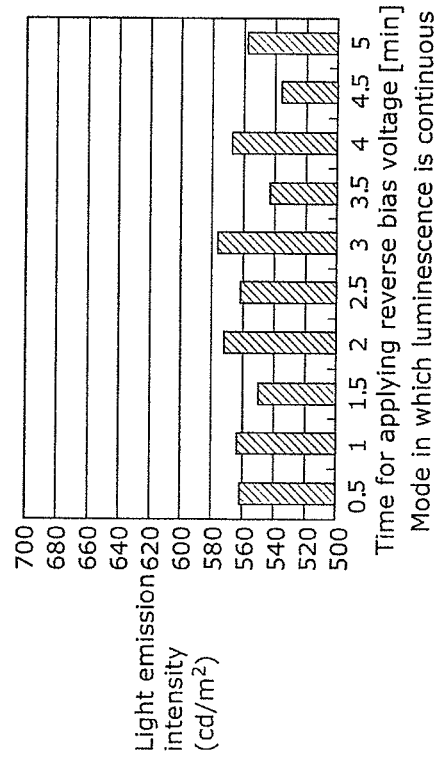
[FIG. 8D]

The imaging point indicated by the graph shown in FIG. 8D is a mode in which light emission is discontinuous. Light emission is detected at random over the light emission operations for the 10th consecutive time.

In other words, in the detection methods for the light leakage point by the graphs shown in FIGS. 8A to 8D, the application of the predetermined reverse bias voltage in Step S01 and the identification of the light leakage point in Step S02 are performed 10 times on the pixel to be checked. It is determined that each of the imaging points indicated by the graphs shown in FIGS. 8A to 8D is a light leakage point since twice of more of light emission is detected in the 10 times of repeated operations.

Figure 9:
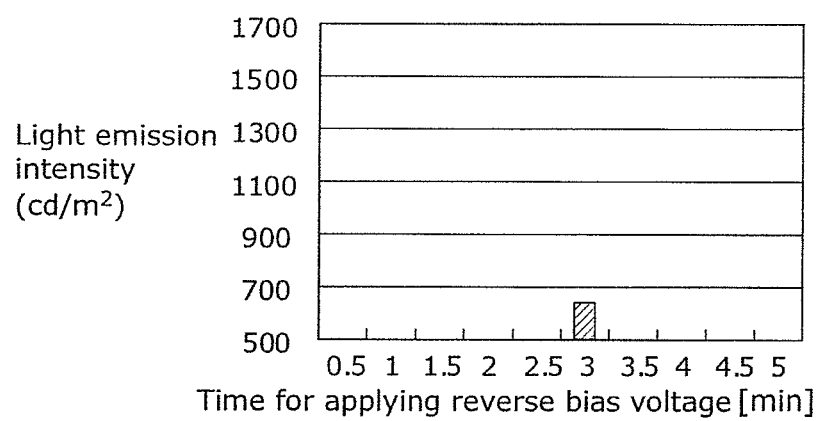
[FIG. 9]

FIG. 9 is a graph showing characteristics of the imaging point which is not determined as the light leakage point in the method of inspection an organic EL display device according to the present disclosure. Since only one time of light emission is detected in the 10 times of repeated operations in the imaging point indicated by the graph shown in FIG. 9, it is determined that the imaging point is not a light leakage point.

From the results of FIGS. 8A to 8D, when the number of repetitions of Steps S01 and S02 is greater, it is possible to certainly detect the light emission changing over time. For example, when the number of repetitions is three times, it is not determined that the pixel including the imaging point that is a subsequent light emission mode in FIG. 8C is a defective pixel. Meanwhile, when the number of repeated time is four times or more, the imaging point in FIG. 8C is identified twice or more as the light leakage point. As a result, it is determined that the pixel including the imaging point is a defective pixel. Moreover, by determining that the pixel including the imaging point which is identified as the light emitting point twice or more is a defective pixel, the detection accuracy can be increased.

Finally, the imaging device 20 displays, on the monitor 21, the pixel 15 which is determined to be a defective pixel in Step S05 (S07).

With the method of inspecting the organic EL display device according to the present disclosure based on the above described steps, when the same light emitting point is identified twice or more of the light emission identification step in a plurality of times of the step by the application of a reverse bias voltage, it is determined that the pixel including the light emitting point is a defective pixel.

Conventionally, the pixel having a short is detected by the application of a reverse bias voltage to the organic EL element and imaging of the light leakage under a completely light-shielding condition. However, pixel defects exists which cannot be detected depending on an imaging timing since the light emission to be imaged changes over time.

The present disclosure makes it possible to image the light emission in a flickering state that is caused by a temporal change and the subsequent luminance. Moreover, this accordingly eliminates noise in the inspection, to increase detection accuracy of the defective pixel. In other words, a plurality of times of imaging is repeated for a predetermined time, coordinates and light emission intensity of the light emitting point are extracted from each of the images, and comparison is made among the coordinates and light emitting points. Then the light emitting point which gains the same light emission a plurality of times is determined to be a defective position, while the light emitting point which gains only one time of the light emission is determined to be noise. This accordingly prevents the escape of the defect, making it possible to manufacture the organic EL display device having high reliability.

Moreover, in the imaging of weak light leakage of the organic EL element, a noise level can be set depending on an imaging situation. Moreover, since the threshold intensity for identifying the light leakage point can be set from the noise level and the offset value which can be set by the inspection system and variations in characteristics among the display panels, it is possible to realize the detection of a defective pixel with high accuracy corresponding to the imaging situation and the light leakage situation.

Moreover, the above described method of inspecting an organic EL display device, that is, Steps S01 to S07 can be applied to part of the method of manufacturing an organic EL display device. With this, it is possible to manufacture a high-quality organic EL display device by passing, to the subsequent repair process, the defective pixel detected with high accuracy by the inspection method according to the present disclosure.

Although only the exemplary embodiment has been described, the scope of the present disclosure is not limited to such. Those skilled in the art will readily appreciate that various modifications may be made in the exemplary embodiment without materially departing from the principles and spirit of the inventive concept, the scope of which is defined in the appended Claims and their equivalents. Therefore, such modifications and other embodiments are included in the present disclosure.

It should be noted that in the detection system shown in FIG. 4, a reverse bias voltage may be applied, instead of from the source meter 22, by selecting the pixel to be checked from the data line drive circuit 13 and the scanning line drive circuit 14 that are included in the organic EL display device 1.

Moreover, in the above described embodiment, the description is made about the case where the inspection process according to the present disclosure is applied to the display unit 12 in the manufacturing process for the organic EL display device 1. The same effect can be obtained from the application of the inspection process according to the present disclosure after the completion of the organic EL display device 1.

The herein disclosed subject matter is to be considered descriptive and illustrative only, and the appended Claims are of a scope intended to cover and encompass not only the particular embodiments disclosed, but also equivalent structures, methods, and/or uses.

Industrial Applicability

A method of inspecting an organic EL display device according to one exemplary embodiment disclosed herein is applicable to a technical field such as a display of a flat-screen television or a personal computer which requires a larger screen and a higher resolution.

The invention claimed is:

1. A method of inspecting an organic electroluminescence (EL) display device which includes pixels each of which includes an organic EL element, the method comprising:
   imaging the pixels for a predetermined time with a reverse bias voltage being applied to the pixels;
   identifying light emitting points which produce, in the imaging, luminance of light leakage that is greater than or equal to threshold intensity, the light emitting points being located within the pixels; and
   determining that a pixel including a one of the light emitting points is a defective pixel when, after plural iterations of the imaging and the identifying, the one light emitting point is identified twice or more in the plural iterations of the identifying,
   wherein the threshold intensity is set based on average luminance of the pixels that is obtained by imaging simultaneous light emission from all the pixels in the imaging.

2. The method of inspecting an organic EL display device according to claim 1,
   wherein a value of the reverse bias voltage is constant for the predetermined time for imaging the pixels in the imaging.

3. The method of inspecting an organic EL display device according to claim 2,
   wherein the value of the reverse bias voltage applied to the pixels is kept unchanged from a start of a first iteration of the imaging to an end of a final iteration of the imaging in the plural iterations of the imaging.

4. The method of inspecting an organic EL display device according to claim 1,
   wherein, in the imaging, application of the reverse bias voltage to the pixels and imaging of the pixels are synchronized.

5. The method of inspecting an organic EL display device according to claim 1,
   wherein the predetermined time for imaging the pixels in the imaging varies from 5 seconds to 60 seconds.

6. The method of inspecting an organic EL display device according to claim 1,
   wherein the imaging and the identifying are each repeated from 3 to 10 times.

7. The method of inspecting an organic EL display device according to claim 1,
   wherein in the imaging, imaging is performed by a cooled charge coupled device (CCD) camera, and
   in the identifying, the light emitting points which produce light leakage are identified based on an image obtained from the imaging.

8. The method of inspecting an organic EL display device according to claim 1,
   wherein when the one light emitting point is identified twice or more in the plural iterations of the identifying and the one light emitting point is not identified in the final iteration of the identifying in the plural iterations of the identifying,
   in the determining, the pixel including the light emitting point is determined as a defective pixel.

9. The method of inspecting an organic EL display device according to claim 1,
   wherein in the imaging, the average luminance of the pixels is calculated as an average value of noise by imaging simultaneous light emission from all the pixels, and
   in the identifying, from an image obtained by imaging light emitted from the pixels or part of the pixels, a light emitting point producing light emission that is greater than or equal to the threshold intensity is identified as a light emitting point producing light leakage, the threshold intensity being a value obtained by adding a predetermined offset value to the average value of noise.

* * * * *